(12) United States Patent
Zhou et al.

(10) Patent No.: US 11,474,181 B2
(45) Date of Patent: Oct. 18, 2022

(54) MRI METHOD AND DEVICE BASED ON A BLADE SEQUENCE, AND STORAGE MEDIUM

(71) Applicant: Siemens Healthcare GmbH, Erlangen (DE)

(72) Inventors: Kun Zhou, Shenzhen (CN); Wei Liu, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 254 days.

(21) Appl. No.: 16/682,702

(22) Filed: Nov. 13, 2019

(65) Prior Publication Data

US 2020/0150207 A1 May 14, 2020

(30) Foreign Application Priority Data

Nov. 13, 2018 (CN) .......................... 201811345684.3

(51) Int. Cl.
*G01V 3/00* (2006.01)
*G01R 33/56* (2006.01)
*G06T 11/00* (2006.01)
*G01R 33/48* (2006.01)

(52) U.S. Cl.
CPC ..... *G01R 33/5608* (2013.01); *G01R 33/4818* (2013.01); *G06T 11/005* (2013.01); *G06T 11/006* (2013.01)

(58) Field of Classification Search
CPC .............. G01R 33/3415; G01R 33/543; G01R 33/5659; G01R 33/36; A61B 5/055

(Continued)

(56) References Cited

U.S. PATENT DOCUMENTS

2007/0001672 A1  1/2007 Patch et al.
2008/0054899 A1* 3/2008 Aksoy ................ G01R 33/5611
                                                              324/307

(Continued)

FOREIGN PATENT DOCUMENTS

CN     101911099 A    12/2010
CN     101995561 A     3/2011

(Continued)

OTHER PUBLICATIONS

CN-102551723-A (Year: 2012).*

(Continued)

*Primary Examiner* — Walter L Lindsay, Jr.
*Assistant Examiner* — Frederick WEnderoth
(74) *Attorney, Agent, or Firm* — Banner & Witcoff Ltd.

(57) ABSTRACT

The present disclosure discloses a magnetic resonance imaging method based on a blade sequence. The method can include acquiring 3-D data collected by a surface coil, determining a corresponding plurality of kernel data of each blade from the 3-D data according to the position information of each blade, collecting a corresponding plurality of slices of aliasing K-space data of each blade, performing convolution operations for the corresponding plurality of slices of aliasing K-space data of each blade and the corresponding plurality of kernel data of each blade to obtain a corresponding plurality of unaliasing K-space data of each blade, and reconstructing images for the corresponding plurality of unaliasing K-space data of different blades to obtain a plurality of unaliasing images. The present disclosure further describes a magnetic resonance imaging device for realizing the method and a computer-readable storage medium.

21 Claims, 7 Drawing Sheets

(58) Field of Classification Search
USPC .......................................................... 324/309
See application file for complete search history.

(56) References Cited

U.S. PATENT DOCUMENTS

| | | | |
|---|---|---|---|
| 2009/0129648 A1 | 5/2009 | Arfanakis et al. | |
| 2011/0075903 A1 | 3/2011 | Turiel Martinez | |
| 2012/0002858 A1 | 1/2012 | Huang et al. | |
| 2014/0285195 A1 | 9/2014 | Stemmer | |
| 2016/0061924 A1 | 3/2016 | Pipe | |
| 2016/0166333 A1* | 6/2016 | Wang | A61B 90/11 600/476 |
| 2017/0011546 A1* | 1/2017 | Zatonyi | G06T 15/503 |
| 2017/0124432 A1 | 5/2017 | Chen et al. | |
| 2018/0120403 A1 | 5/2018 | Liu et al. | |

FOREIGN PATENT DOCUMENTS

| | | | | |
|---|---|---|---|---|
| CN | 102362192 A | | 2/2012 | |
| CN | 102551723 A | * | 7/2012 | |
| CN | 103218795 A | | 7/2013 | |
| CN | 104068859 A | | 10/2014 | |
| CN | 106649542 A | | 5/2017 | |
| CN | 108020796 A | | 5/2018 | |
| WO | WO-2008137783 A2 | * | 11/2008 | ......... G01R 33/5611 |
| WO | 2014006633 A1 | | 1/2014 | |
| WO | WO-2015057745 A1 | * | 4/2015 | ......... G01R 33/4824 |

OTHER PUBLICATIONS

Lyu, Mengye et al. "Multi-band Propeller Imaging with Autocalibration" Proceedings of The International Society for Magnetic Resonance in Medicine, ISMRM, 23rd Annual Meeting and Exhibition,Toronto, Ontario, Canada, May 30-Jun. 5, 2015 // Abstract No. 2411.

Pipe, James G. "Motion Correction With Propeller MRI: Application to Head Motion and Free-Breathing Cardiac Imaging" Magnetic Resonance in Medicine, vol. 42, No. 5, pp. 963-969, 1999.

Larkman, David J. et al. "Use of Multicoil Arrays for Separation of Signal from Multiple Slices Simultaneously Excited" Journal of Magnetic Resonance Imaging; vol. 13; pp. 313-317; 2001.

Li, Zhiqiang et al. "X-PROP: A fast and robust diffusion-weighted propeller technique" Magnetic Resonance in Medicine, vol. 66, No. 2, pp. 341-347, Aug. 2011 // https://doi.org/10.1002/mrm.23033.

Norbeck, Ola et al. "Self-Calibrated Simultaneous Multi-Slice Propeller" Proceedings of The International Society for Magnetic Resonance in Medicine; ISMRM; 23rd Annual Meeting and Exhibition; Toronto; Ontario; Canada; May 30-Jun. 5, 2015; Nr. 245, May 15, 2015 (May 15, 2015) XP040665928.

Setsompop, Kawin et al. "Blipped-Controlled Aliasing in Parallel Imaging for Simultaneous Multislice Echo Planar Imaging with Reduced g-Factor Penalty" Magnetic Resonance in Medicine, vol. 67, pp. 1210-1224, 2012 (first published online 2011) // DOI 10.1002/mrm.23097.

Weng De-He, "Technical detail of BLADE" Chinese Journal Magnetic resonance imaging, vol. 1, No. 5, pp. 376-379, 2010 (English-language Abstract included).

Johnson et al. "Convolution Kernel Design and Efficient Algorithm for Sampling Density Correction" Magnetic Resonance in Medicine vol. 61, pp. 439-447, 2009.

Qin Wen et al. "Principle and applications of PROPELLER technique" Journal Med Imaging vol. 15 No. 10, pp. 912-915, 2005 (English-language Abstract included).

Chinese Action dated Sep. 17, 2021, Application No. 201811345684.3.

* cited by examiner

MRI METHOD AND DEVICE BASED ON A BLADE SEQUENCE, AND STORAGE MEDIUM

CROSS REFERENCE TO RELATED APPLICATIONS

This patent application claims priority to Chinese Patent Application No. 201811345684.3, filed Nov. 13, 2018, which is incorporated herein by reference in its entirety.

BACKGROUND

Field

The present disclosure relates to the technical field of MRI, and in particular relates to an MRI method and device based on a blade sequence, and a computer-readable storage medium.

Related Art

Among numerous MRI techniques, the simultaneous multi-slice (SMS) scan technique can be used to simultaneously scan a plurality of slices of images, thus reducing the scan time and greatly improving the imaging speed, especially in the applications where multiple rescans are required, for example, blood oxygen level dependent—functional magnetic resonance imaging (BOLD-fMRI) and diffusion magnetic resonance imaging (diffusion MRI). In these applications, the first scan result obtained in the rescan process will be used to acquire the full-slice data and will be used as an auto calibration signal (ACS) to perform imaging reconstruction processing for a plurality of slices of aliasing image data obtained from later multiple rescans.

In addition, a blade sequence, or propeller sequence has been more and more widely applied in MRI because of motion insensitivity to guarantee the imaging effect and improve the image definition. However, since it is necessary to repeatedly scan the central area of K-space multiple times when a blade sequence is used for scanning, the time for data acquisition is greatly prolonged so that the whole scanning process is too long.

For this reason, the combination of the SMS technique and the BLADE sequence technique, called SMS-BLADE, can be considered in practical clinical applications to overcome the problems with an unsatisfactory imaging effect caused by motion and a long scan time to achieve the purpose of reducing the scan time as much as possible while guaranteeing the imaging effect. However, the signal calibration of SMS-BLADE is not so direct because the data of each blade of SMS-BLADE has different phase encoding directions. Thus, the same ACS cannot be used for image reconstructions of the corresponding image data of different blades. That is to say, as far as the image reconstruction of SMS-BLADE is concerned, it is necessary to separately acquire an ACS for each blade respectively, or, it is necessary to separately scan a reference signal for each blade respectively to acquire the corresponding ACS data. This consumes time and also greatly neutralizes the advantage which the SMS technique brings about in the aspect of scan time reduction.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
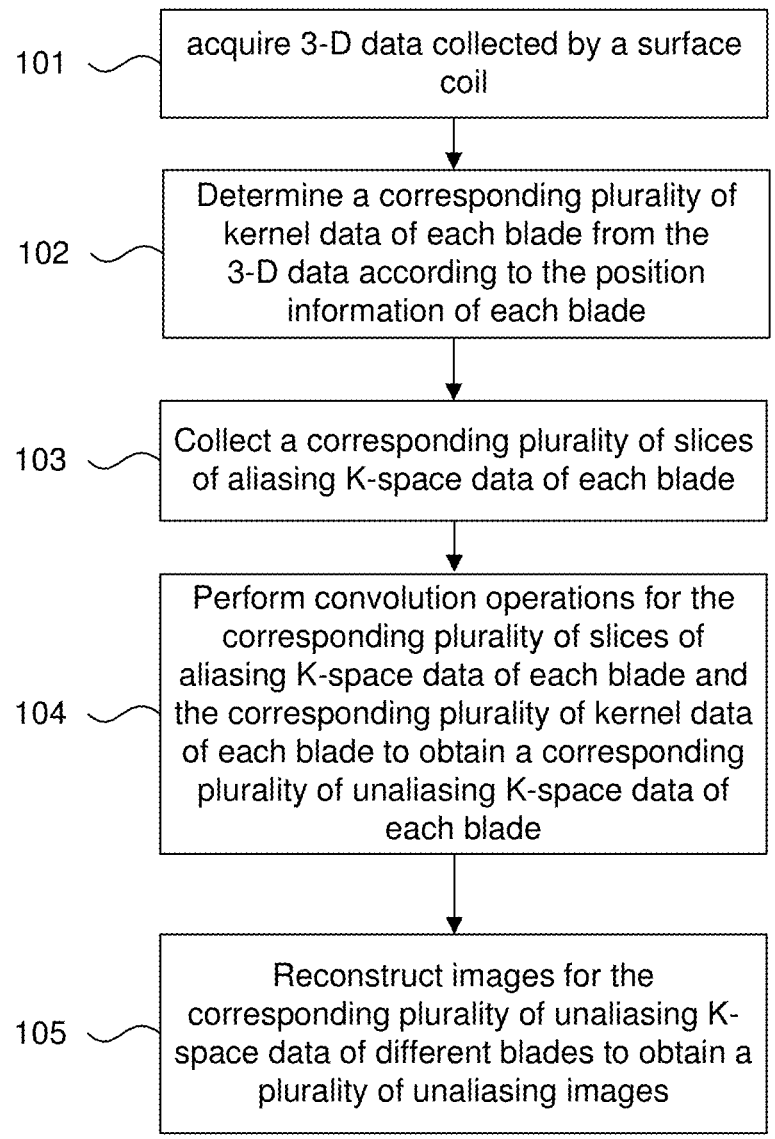
FIG. 1 is a flowchart of a MRI method based on a blade sequence according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

To solve the above-mentioned problems, the present disclosure provides an MRI method based on a blade sequence. The method comprises acquiring 3-D data collected by a surface coil, determining a corresponding plurality of kernel data of each blade from the 3-D data according to the position information of each blade, collecting a corresponding plurality of slices of aliasing K-space data of each blade, performing convolution operations for the corresponding plurality of slices of aliasing K-space data of each blade and the corresponding plurality of kernel data of each blade to obtain a corresponding plurality of unaliasing K-space data of each blade, and reconstructing images for the corresponding plurality of unaliasing K-space data of different blades to obtain a plurality of unaliasing images.

Through the MRI method based on a blade sequence, the SMS technique and the BLADE sequence technique can organically be combined, and the corresponding data of each blade can directly be determined from the pre-collected other data at the time of kernel fitting, without any necessity of separately scanning the reference signal for each blade respectively. Thus, the MRI method based on a blade sequence has not only the advantage of a short scan time brought about by the SMS technique, but also the advantage of motion insensitivity brought about by the BLADE sequence technique, that is to say, the MRI method based on a blade sequence can reduce the scan time while guaranteeing the imaging effect.

In the embodiments of the present application, the 3-D data comprises 3-D pre-scan data and 3-D field mapping data.

The 3-D data is collected by a surface coil when a pre-scan is performed before a formal scan begins, and is usually used to balance the inhomogeneity caused by a local coil or measure the inhomogeneity of the main magnetic field. Therefore, it is unnecessary to separately perform a scan to acquire the 3-D data, thus saving the scan time.

In the embodiments of the present application, the determining a corresponding plurality of kernel data of each blade from the 3-D data comprises performing the following operations for each blade, respectively: performing interpolation calculations for the 3-D data according to the position information of the blade to obtain a corresponding plurality of image data of the blade, transforming the plurality of image data to K-space respectively to obtain a corresponding plurality of K-space data of the blade, and performing kernel fitting for the plurality of K-space data to obtain a corresponding plurality of kernel data of the blade.

In this way, the corresponding kernel data of each blade can directly be determined from the pre-collected 3-D data, without any necessity of separately scanning the reference signal for each blade respectively, thus saving the scan time.

In the embodiments of the present application, the determining a corresponding plurality of kernel data of each blade from the 3-D data further comprises performing a slice shift in the image domain or K-space for the plurality of image data obtained from interpolation calculations.

Particularly, performing a slice shift in the image domain for the plurality of image data obtained from interpolation calculations comprises respectively translating the plurality of image data obtained from interpolation calculations a preset number of pixel point positions in the image domain before transforming the image data to K-space.

Alternatively, performing a slice shift in K-space for the plurality of image data obtained from interpolation calculations comprises respectively applying a linear gradient in the phase encoding direction of each image datum in K-space after transforming the image data to K-space.

By performing a slice shift in the image domain or K-space for the plurality of image data obtained from interpolation calculations, the distance between a plurality of slices of aliasing images can be increased. Thus, the purpose of reducing aliasing artifacts and the g-factor penalty can be achieved and the image definition can be improved.

In the embodiments of the present application, the position information of each blade comprises the FOV, slice position information and slice direction information of each blade, and performing interpolation calculations for the 3-D data according to the position information of the blade to obtain a corresponding plurality of image data of the blade comprises: obtaining the spatial position coordinates of each corresponding pixel of the blade according to the FOV, slice position information and slice direction information of the blade, and respectively taking the corresponding data of the spatial position coordinates out of the 3-D data according to the spatial position coordinates of each corresponding pixel of the blade through interpolation calculations.

Through the interpolation calculation method, a corresponding plurality of image data of each blade can be obtained so as to perform subsequent kernel fitting to obtain the corresponding kernel data of each blade.

In the embodiments of the present application, the performing kernel fitting for the plurality of K-space data comprises: using a plurality of image data which is acquired from the 3-D data, corresponds to a blade and respectively corresponds to a plurality of different slices as unaliasing image data, using the image data obtained by overlaying the plurality of image data as aliasing image data, and performing transposed convolution operations according to the unaliasing image data and the aliasing image data to obtain the corresponding kernel data of different slices of images.

Through the kernel fitting process, a corresponding plurality of kernel data of each blade can be obtained according to a plurality of images obtained from interpolation calculations of 3-D data, without any necessity of separately scanning the reference signal.

In the embodiments of the present application, the reconstructing images for the corresponding plurality of unaliasing K-space data of different blades comprises: putting the corresponding unaliasing K-space data of the blades corresponding to the same slice in a group to obtain a plurality of groups of unaliasing K-space data, wherein each group of unaliasing K-space data corresponds to one slice of images, and for each group of unaliasing K-space data, respectively using the blade reconstruction method to reconstruct images for the corresponding plurality of unaliasing K-space of different blades to obtain a plurality of reconstructed unaliasing images.

Through the blade reconstruction process, images can be reconstructed according to the corresponding plurality of unaliasing K-space of different blades to obtain a plurality of reconstructed unaliasing images. Since it is necessary to scan the central area of K-space for the blade sequence, the problem with the image quality decrease caused by the motion of the scanned object during the scan can be overcome.

In the embodiments of the present application, the MRI method further comprises setting a plurality of readout gradients in a readout period for reading out a sequence so that a corresponding plurality of slices of aliasing K-space data of a plurality of blades can be read out simultaneously through an excitation.

By use of the multi-blade readout technique, a corresponding plurality of slices of aliasing K-space data of a plurality of blades can simultaneously be read out through an excitation, and thus the scan time is further reduced.

The present disclosure further provides an MRI device based on a blade sequence. The MRI device comprises:

a pre-scanner 601, used to acquire 3-D data collected by a surface coil, a kernel determiner 602, used to determine a corresponding plurality of kernel data of each blade from the 3-D data according to the position information of each blade, a data acquirer 603, used to collect a corresponding plurality of slices of aliasing K-space data of each blade, a convoluter 604, used to perform convolution operations for the corresponding plurality of slices of aliasing K-space data of each blade and the corresponding plurality of kernel data of each blade to obtain a corresponding plurality of unaliasing K-space data of each blade, and an image reconstructor 605, used to reconstruct images for the corresponding plurality of unaliasing K-space data of different blades to obtain a plurality of unaliasing images.

In an exemplary aspect, the kernel determiner 602 comprises:

an interpolater 701, used to perform interpolation calculations for the 3-D data according to the position information of the blade to obtain a corresponding plurality of image data of the blade, a transformer 702, used to transform the plurality of image data to K-space respectively to obtain a corresponding plurality of K-space data of the blade, and a kernel fitter 703, used to perform kernel fitting for the plurality of K-space data to obtain a corresponding plurality of kernel data of the blade.

Through the MRI device based on a blade sequence, the SMS technique and the BLADE sequence technique can organically be combined, and the corresponding kernel data of each blade can directly be determined from the pre-collected other data at the time of signal calibration, without any necessity of separately scanning the reference signal for each blade respectively. Thus, the MRI device based on a blade sequence has not only the advantage of a short scan time brought about by the SMS technique, but also the advantage of motion insensitivity brought about by the BLADE sequence technique, that is to say, the MRI device based on a blade sequence can reduce the scan time while guaranteeing the imaging effect.

In the embodiments of the present application, the kernel determiner 602 further comprises a slice shifter, used to perform a slice shift in the image domain or K-space for the plurality of image data obtained from interpolation calculations, and the kernel fitter 703 performs kernel fitting for the plurality of shifted K-space data.

In an exemplary aspect, the slice shifter comprises: a first slice shifter 802, used to respectively translate a plurality of image data output from the interpolater a preset number of pixel point positions in the image domain.

Alternatively, the slice shifter comprises: a second slice shifter 903, used to respectively apply a linear gradient in the phase encoding direction of a plurality of K-space data output from the transformer to obtain a plurality of shifted K-space data.

By performing a slice shift in the image domain or K-space for the plurality of image data obtained from interpolation calculations, the distance between a plurality of slices of aliasing images can be increased. Thus, the purpose of reducing aliasing artifacts and the g-factor penalty can be achieved.

The present disclosure further provides an MRI device. The MRI device comprises at least one memory 1010 and at least one processor 1020, wherein the at least one memory 1010 is configured to store computer programs, and the at least one processor 1020 is configured to invoke the computer program stored in the at least one memory to execute the MRI method based on a blade sequence.

The embodiments of the present application further provide a computer-readable storage medium having a computer program stored therein, and the MRI method based on a blade sequence is realized when a processor executes the computer program.

To make clearer the object, technical solutions and advantages of the present disclosure, the technical solutions in the embodiments of the present disclosure will clearly and completely be described below in combination with the drawings in the embodiments of the present disclosure. Obviously, the embodiments described are only a part, but not all of the embodiments of the present disclosure. All other embodiments obtained by those skilled in the art on the basis of the embodiments of the present disclosure without any creative work should fall within the scope of protection of the present disclosure.

The terms "comprise" and "have" and their variants in the description and claims of the present disclosure are intended to cover non-exclusive inclusions. For example, the process or method comprising a series of steps or the system, product or equipment comprising a series of units are unnecessarily limited to those listed steps or units, but can comprise other steps or units which are not clearly listed or are intrinsic to the process, method, product or equipment.

As previously described, when the SMS technique is combined with the BLADE sequence technique, the data of each blade of SMS-BLADE has different phase encoding directions. Therefore, in order to reconstruct images for the plurality of slices of aliasing image data obtained from one scan to obtain unaliasing image data, it is necessary to separately scan the reference signal for each blade respectively to obtain the corresponding ACS data. The requirement greatly neutralizes the contribution brought about by the SMS technique to the reduction of the scan time and the purpose of reducing the scan time as much as possible while guaranteeing that the imaging effect cannot be achieved.

For this purpose, the embodiments of the present application provide an MRI method based on a blade sequence. The method can acquire the corresponding ACS data of each blade without separately scanning the reference signal for each blade. Thus, the time necessary for SMS-BLADE scanning is greatly shortened and the purpose of reducing the scan time as much as possible while guaranteeing the imaging effect can be achieved.

FIG. 1 shows the flow of the MRI method based on a blade sequence in the embodiments of the present application. As shown in FIG. 1, the MRI method based on a blade sequence in the embodiments of the present application comprises:

Step 101: acquire 3-D data collected by a surface coil,

Step 102: Determine a corresponding plurality of kernel data of each blade from the 3-D data according to the position information of each blade, Step 103: Collect a corresponding plurality of slices of aliasing K-space data of each blade, Step 104: Perform convolution operations for the corresponding plurality of slices of aliasing K-space data of each blade and the corresponding plurality of kernel data of each blade to obtain a corresponding plurality of unaliasing K-space data of each blade, and Step 105: Reconstruct images for the corresponding plurality of unaliasing K-space data of different blades to obtain a plurality of unaliasing images.

Thus, it can be seen that in the MRI method based on a blade sequence, the corresponding plurality of kernel data of each blade is directly determined from the 3-D data obtained by a surface coil through a scan according to the position information of the blade, without separately scanning the reference signal for each blade, and thus the scan time is greatly shortened.

The steps will be described in detail below in combination with the drawings and specific examples.

For Step 101, the 3-D data can be collected by a surface coil when a pre-scan is performed before a formal scan begins.

In some embodiments of the present application, the 3-D data can be pre-scan data which is used to balance the inhomogeneity caused by a local coil and is pre-collected by a surface coil.

In some embodiments of the present application, the 3-D data can be 3-D field mapping data which is used to measure the inhomogeneity of the main magnetic field and is pre-collected by a surface coil.

In the embodiments of the present application, the 3-D data should have a large FOV. To be specific, the FOV of 3-D data should be greater than the FOV of the blade sequence. In this way, all the information necessary for calculating kernel data is included in such 3-D data so that the kernel data determined according to the 3-D data is more accurate.

For the Step 102, in the embodiments of the present application, the position information of the blade, namely, the spatial position information of each blade, can particularly comprise the FOV, slice position information and slice direction information of each blade. All this information is predetermined before a formal scan.

In addition, in the embodiments of the present application, determining a corresponding plurality of kernel data of each blade from the 3-D data according to the position information of each blade can particularly be realized in the following ways.

Figure 2:
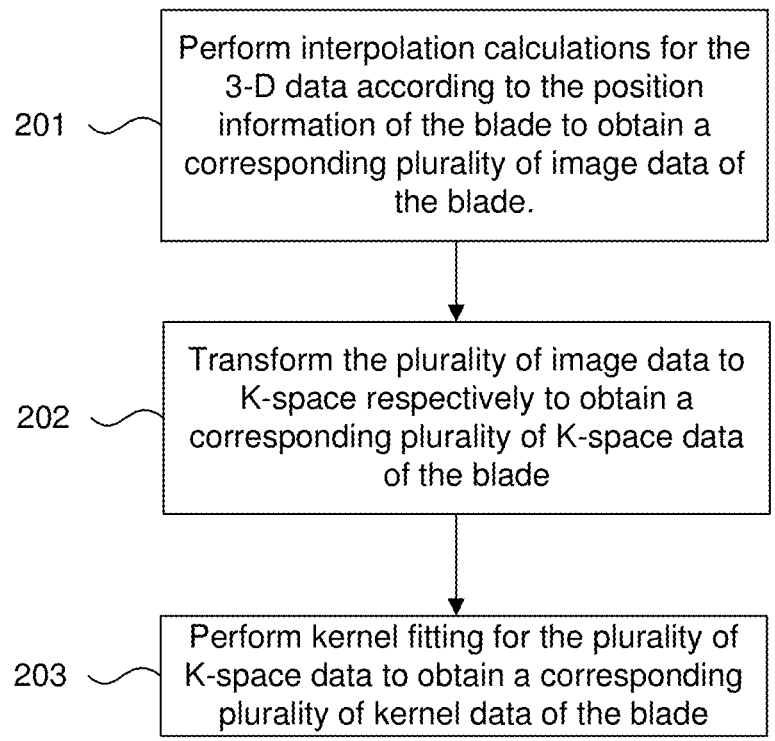
FIG. 2 is a flowchart of a method according to an exemplary embodiment to determine a corresponding plurality of kernel data of each blade from 3-D data according to the position information of each blade.

FIG. 2 shows the flow of the determining a corresponding plurality of kernel data of each blade from the 3-D data according to the position information of each blade in one embodiment of the present application.

As shown in FIG. 2, the following operations are respectively performed for each blade in the method:

Step 201: Perform interpolation calculations for the 3-D data according to the position information of the blade to obtain a corresponding plurality of image data of the blade.

Wherein, in some embodiments of the present application, the amount of the plurality of image data is related to the number of slices simultaneously scanned in the SMS technique. To be specific, the amount of image data obtained from interpolations can be the same as the number of slices simultaneously scanned in the SMS technique, that is to say, the amount of image data obtained from 3-D data through interpolations in this step is equal to the number of slices of the collected aliasing images. In addition, the plurality of image data obtained by use of the method respectively corresponds on a one to one basis to the simultaneously scanned slices.

To be specific, in the Step 201, the spatial position coordinates of corresponding each pixel of the blade can be obtained according the FOV, slice position information and slice direction information of the blade, and then the corresponding data of the coordinates can be taken out of the 3-D data according to the spatial position coordinates of corresponding each pixel of the blade through interpolation calculations. That is to say, a plurality of image data of a corresponding plurality of slices of each blade is acquired from the 3-D data according to the FOV, slice position information and slice direction information of each blade through interpolation calculations.

Step 202: Transform the plurality of image data to K-space respectively to obtain a corresponding plurality of K-space data of the blade.

In some embodiments of the present application, the transforming image data in the image domain to the frequency domain (K-space) can be realized by use of a prior transformation method, for example, fast Fourier transform (FFT). The plurality of K-space data obtained in the Step 202 also respectively corresponds on a one to one basis to the simultaneously scanned slices.

Step 203: Perform kernel fitting for the plurality of K-space data to obtain a corresponding plurality of kernel data of the blade.

In some embodiments of the present application, the kernel fitting can be realized by use of a prior kernel fitting method.

To be specific, in the embodiments of the present application, the kernel fitting can be realized by use of the following exemplified method.

It is assumed that S1 and S2 are two slices of images, S12 is the aliasing signal of S1 and S2 obtained from one excitation in the SMS technique, and K1 and K2 are the corresponding kernels of the two slices of images. In this case, according to the principle of the SMS technique, S1, S2, K1, K2 and S12 satisfy following relational formula (1):

$$S1=S12*K1 \text{ and } S2=S12*K2 \qquad (1)$$

Wherein, the operation symbol * represents a convolution operation.

To obtain unaliasing image data S1 and S2 based on the relationship, K1, K2 and S12 must be known. Usually, S12 is collected through a scan and is known. Therefore, K1 and K2 are the key to image reconstruction in the SMS technique.

Similarly, according to the principle of the SMS technique: S1=S12*K1 and S2=S12*K2, the following relational formula (2) can be derived:

$$K1=S1/S12 \text{ and } K2=S2/S12 \qquad (2)$$

where, the operation symbol/represents a transposed convolution operation.

That is to say, if unaliasing image data S1 and S2 and aliasing image data S12 are known, K1 and K2 can be obtained from the relational formula (2). This can be generalized to the processing of a plurality of slices of images. That is to say, if different slices of unaliasing image data and aliasing image data are known, the corresponding kernel data of different slices can be obtained through a transposed convolution operation similar to relational formula (2). The process of obtaining kernel data according to unaliasing data and aliasing data is called a kernel fitting process.

Corresponding to the method in the present application, the kernel fitting process can particularly comprise considering a plurality of image data which is acquired from the 3-D data, corresponds to a blade and respectively corresponds to a plurality of different slices as unaliasing image data in the kernel fitting process, and considering the image data obtained by overlaying a plurality of image data which is acquired from the 3-D data, corresponds to a blade and respectively corresponds to a plurality of different slices as aliasing image data, and performing the transposed convolution operations according to the unaliasing image data and the aliasing image data to obtain the corresponding kernel data of different slices of images.

Through the method shown in FIG. 2, a plurality of kernel data of each blade can be acquired from the 3-D data obtained in advance, without separately scanning the reference signal for each blade, thus shortening the scan time for MRI greatly.

In addition, in the SMS technique, if the distance between a plurality of slices of images simultaneously excited is close, aliasing artifacts and the g-factor penalty will increase because of the limited spatial sensitivity of the coil. To solve such a problem, in some embodiments of the present application, the Blipped-CAIPI method can be combined on the basis of the method to produce a shift between images in the phase encoding direction of an SMS-BLADE sequence. Thus, the distance between a plurality of slices of aliasing images is increased and aliasing artifacts and the g-factor penalty are lowered. Particularly, in order to produce a shift between images in the phase encoding direction of an SMS-BLADE sequence, a blip gradient can be added in the pre-calculated position in the corresponding sequence of the slice selection coil in the SMS-BLADE sequences in the embodiments of the present application, that is to say, the blip gradient is added to the spoiled gradient in the slice selection direction.

In this case, in order to increase the distance between different slices of images, a slice shift can further be performed for a plurality of image data obtained from interpolation calculations in the image domain or K-space on the basis of the method shown in FIG. 2. A detailed description is given below through an example.

Figure 3:
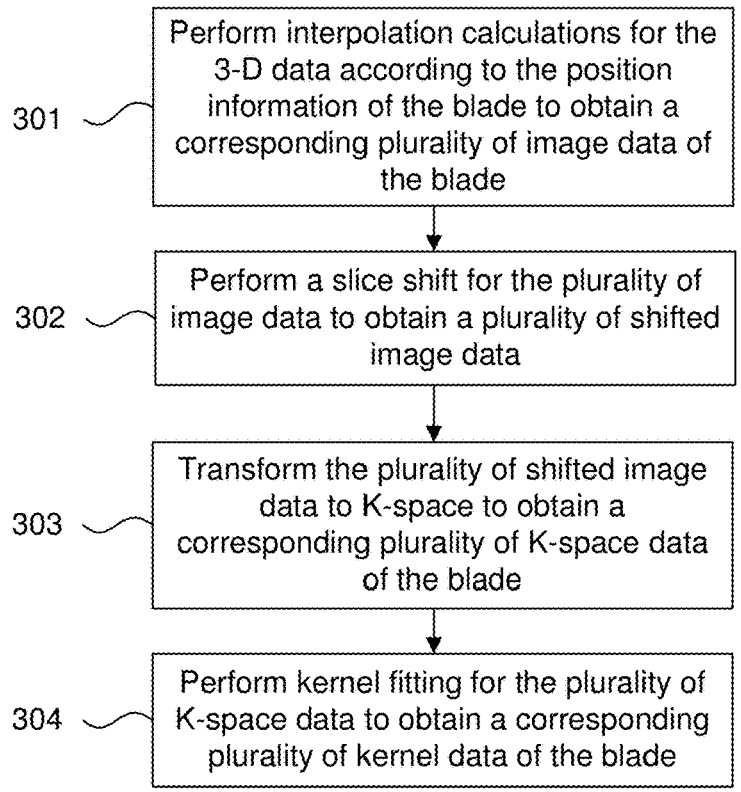
FIG. 3 is a flowchart of a method according to an exemplary embodiment to determine a corresponding plurality of kernel data of each blade from 3-D data according to the position information of each blade.

According to one embodiment of the present application, a corresponding plurality of kernel data of each blade can be determined from the 3-D data according to the position information of each blade by use of the method shown in FIG. 3. The method particularly comprises:

Step 301: Perform interpolation calculations for the 3-D data according to the position information of the blade to obtain a corresponding plurality of image data of the blade.

In some embodiments of the present application, the Step 301 can be realized by use of the same method which is used to realize Step 201.

Step 302: Perform a slice shift for the plurality of image data to obtain a plurality of shifted image data.

In some embodiments of the present application, the slice shift specifically means performing a shift for a plurality image data respectively in the image domain to increase the distance between the plurality of images. The shift can particularly comprise translating the corresponding images of different slices a preset number of pixel point positions in the image domain. In addition, in order to guarantee the match between the plurality of image positions obtained from interpolation calculations and the blade positions actually collected, it is necessary perform a shift for the plurality of images obtained through interpolation calculations.

Step 303: Transform the plurality of shifted image data to K-space to obtain a corresponding plurality of K-space data of the blade.

In some embodiments of the present application, the Step 303 can be realized by use of the same method which is used to realize Step 202.

Step 304: Perform kernel fitting for the plurality of K-space data to obtain a corresponding plurality of kernel data of the blade.

In some embodiments of the present application, the Step 304 can be realized by use of the same method which is used to realize Step 203.

Figure 4:
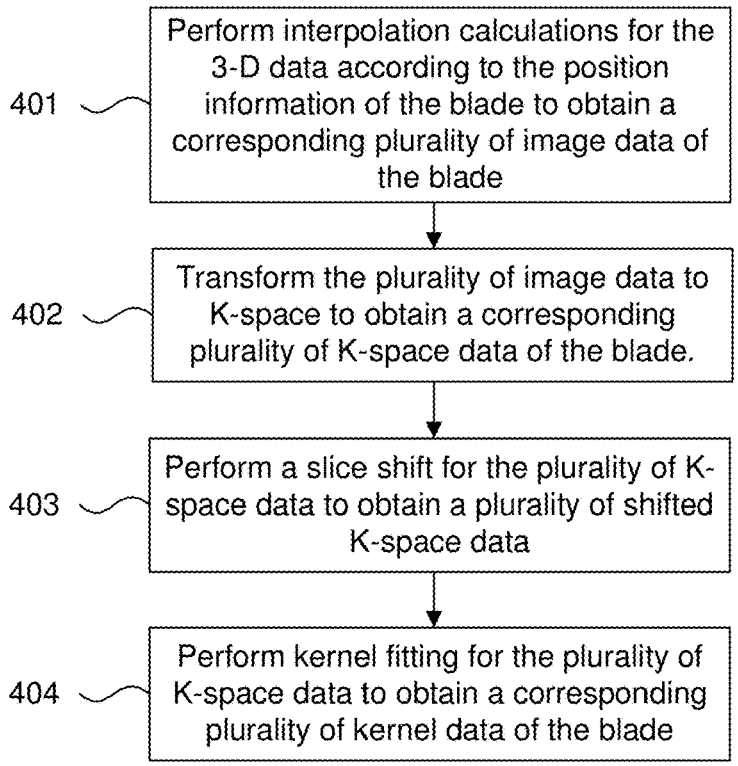
FIG. 4 is a flowchart of a method according to an exemplary embodiment to determine a corresponding plurality of kernel data of each blade from 3-D data according to the position information of each blade.

According to another embodiment of the present application, a corresponding plurality of kernel data of each blade can be determined according to the position information of each blade and the 3-D data by use of the method shown in FIG. 4. The method particularly comprises:

Step 401: Perform interpolation calculations for the 3-D data according to the position information of the blade to obtain a corresponding plurality of image data of the blade.

In some embodiments of the present application, the Step 401 can be realized by use of the same method which is used to realize Step 201.

Step 402: Transform the plurality of image data to K-space to obtain a corresponding plurality of K-space data of the blade.

In some embodiments of the present application, the Step 402 can be realized by use of the same method which is used to realize Step 202.

Step 403: Perform a slice shift for the plurality of K-space data to obtain a plurality of shifted K-space data.

In some embodiments of the present application, the slice shift specifically means adding a linear phase to a plurality image data respectively in K-space of the frequency domain to increase the distance between the plurality of slices of images. The shift can particularly comprise applying a linear gradient in the phase encoding (PE) direction of different slices of images in K-space. In order to guarantee the match between the plurality of image positions obtained from interpolation calculations and the blade positions actually collected, it is necessary perform a shift for the plurality of images obtained through interpolation calculations.

It should be noted that applying a linear phase in K-space is equivalent to shifting pixels in the image domain because a linear phase change in K-space itself corresponds to a shift in the image domain. Particularly, a phase change of $2\pi$ in K-space corresponds to the shift of one pixel in the image domain.

Step 404: Perform kernel fitting for the plurality of K-space data to obtain a corresponding plurality of kernel data of the blade.

In some embodiments of the present application, the Step 404 can be realized by use of the same method which is used to realize Step 203.

Through the methods shown in FIGS. 3 and 4, a plurality of kernel data of each blade can be acquired from the 3-D data obtained in advance, without separately scanning the reference signal for each blade, thus shortening the scan time greatly. In addition, the methods shown in FIGS. 3 and 4 can further increase the distance between a plurality of slices of aliasing images by performing a slice shift in the image domain or K-space for the plurality of image data obtained from interpolation calculations. Thus, the purpose of reducing aliasing artifacts and the g-factor penalty can be achieved.

For the Step 103, an SMS-BLADE sequence can be adopted to collect a corresponding plurality of slices of aliasing K-space data of each blade in the embodiments of the present application.

For the Step 104, since each blade corresponds to a plurality of, for example, N, kernel data, then the corresponding N kernel data of the blade is respectively convolved with the corresponding plurality of slices of aliasing K-space data for each blade to obtain the corresponding N unaliasing K-space data of the blade. Wherein, N is an integer greater than 1. This process is also called Slice-GRAPPA (SG) reconstruction.

In the embodiments of the present application, the corresponding N unaliasing K-space data of each blade respectively corresponds to N slices of data simultaneously collected.

For the Step 105, the corresponding unaliasing K-space data of the blades corresponding to the same slice can particularly be put in a group to obtain N groups of unaliasing K-space data, wherein each group of unaliasing K-space data corresponds to one slice of images, and then, for each group of unaliasing K-space data, the blade reconstruction method can be used to respectively reconstruct images for the corresponding plurality of unaliasing K-space of different blades to obtain a plurality of reconstructed unaliasing images.

Thus, it can be seen that through the MRI method, the SMS technique and the BLADE sequence technique can organically be combined, and the corresponding kernel data of each blade can directly be determined from the pre-collected other data at the time of signal calibration, without any necessity of separately scanning the reference signal for each blade respectively. Thus, the MRI method has not only the advantage of a short scan time brought about by the SMS technique, but also the advantage of motion insensitivity brought about by the BLADE sequence technique, that is to say, the MRI method can reduce the scan time while guaranteeing the imaging effect.

To further reduce the scan time, the multi-blade readout technique can be combined on the basis of the method, that is to say, a plurality of readout gradients can be set in a readout period so that a corresponding plurality of slices of aliasing K-space data of a plurality of blades can be read out simultaneously through an excitation. In some embodiments of the present application, usually no more than 5 readout gradients are set in a readout period so as to guarantee the imaging effect.

Figure 5:
FIG. 5 shows an example of using the multi-blade readout technique to read out a sequence on a coil in an exemplary embodiment.

FIG. 5 shows an example of using the multi-blade readout technique to read out a sequence on a coil in one embodiment of the present application. From FIG. 5, it can be seen that each readout period contains three readout gradients 501, 502 and 503, that is to say, the corresponding plurality of slices of aliasing image data of three blades can be read out once to reduce the signal acquisition time to about ⅓ of the original signal acquisition time, and thus the data acquisition process is further sped up.

Corresponding to the MRI method, the embodiments of the present application further disclose an MRI device based on a blade sequence.

Figure 6:
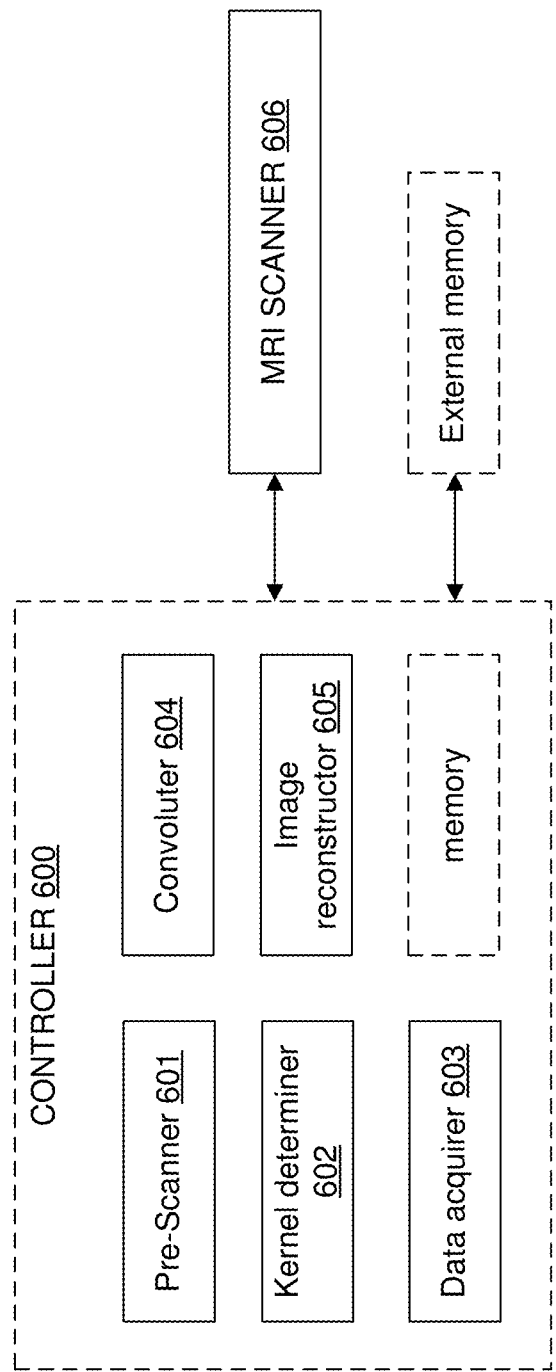
FIG. 6 shows a MRI device, according to an exemplary embodiment, configured to perform a blade sequence.

FIG. 6 shows a schematic representation of a magnetic resonance imaging (MRI) system according to an exemplary embodiment. In an exemplary embodiment, the MRI system includes a magnetic resonance scanner (data acquisition unit) 606 with an examination space or patient tunnel in which a patient or test person is positioned on a driven bed, in whose body the actual examination object is located.

The magnetic resonance scanner 606 is typically equipped with a basic field magnet system, a gradient system as well as an RF transmission antenna system and an RF reception antenna system.

The basic field magnet system is configured to generate a basic magnetic field in the longitudinal direction of the patient P, i.e. along the longitudinal axis of the magnetic resonance scanner 606. The gradient system typically includes individually controllable gradient coils in order to be able to switch (activate) gradients independently of one another.

The MRI system further includes a pre-scanner 601, a kernel determiner 602, a data acquirer 603, convoluter 604, and image reconstructor 605. In an exemplary embodiment, the pre-scanner 601 is configured to acquire 3-D data collected by a surface coil of the scanner 606.

In an exemplary embodiment, the kernel determiner 602 is configured to determine a corresponding plurality of kernel data of each blade from the 3-D data according to the position information of each blade. In an exemplary embodiment, the data acquirer 603 is configured to collect a corresponding plurality of slices of aliasing K-space data of each blade. In an exemplary embodiment, the convoluter 604 is configured to perform convolution operations for the corresponding plurality of slices of aliasing K-space data of each blade and the corresponding plurality of kernel data of each blade to obtain a corresponding plurality of unaliasing K-space data of each blade. In an exemplary embodiment, the image reconstructor 605 is configured to reconstruct images for the corresponding plurality of unaliasing K-space data of different blades to obtain a plurality of unaliasing images.

In an exemplary embodiment, the MRI system includes a controller 600, where the controller 600 includes the pre-scanner 601, kernel determiner 602, data acquirer 603, convoluter 604, and image reconstructor 605. The controller 600 (or one or more components therein) can be configured to control the MRI system. In an exemplary embodiment, the controller 600 (or one or more components therein) includes processor circuitry that is configured to perform one or more respective functions and/or operations of the controller 600 (or the respective component(s)). In an exemplary embodiment, the MRI system (e.g. in controller 600) further includes a memory and/or is configured to be in communication with an external memory.

Thus, it can be seen that in the MRI device, the corresponding plurality of kernel data of each blade is directly determined from the 3-D data obtained by a surface coil through a scan according to the position information of the blade, without separately scanning the reference signal for each blade, and thus the scan time is greatly shortened.

As previously described, the 3-D data can be collected by a surface coil when a pre-scan is performed before a formal scan begins, and can be pre-scan data which is used to balance the inhomogeneity caused by a local coil and is pre-collected by a surface coil, or 3-D field mapping data which is used to measure the inhomogeneity of the main magnetic field and is pre-collected by a surface coil.

The position information of the blade can particularly comprise the spatial position information, FOV, slice position information and slice direction information of the blade.

Figure 7:
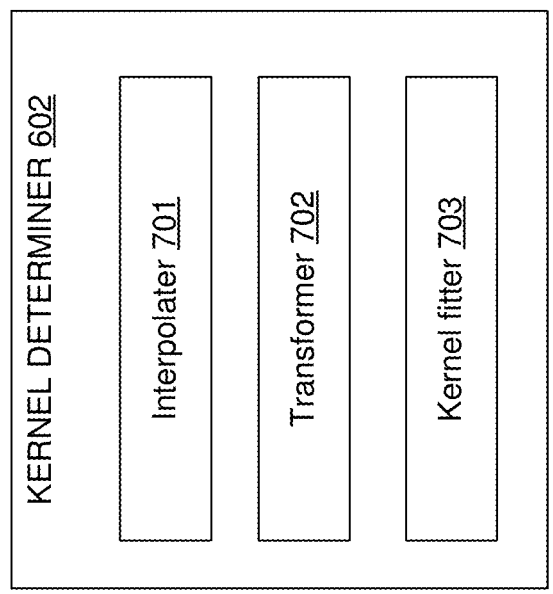
FIG. 7 shows a kernel determiner according to an exemplary embodiment.

As shown in FIG. 7, in one or more exemplary embodiments, the kernel determiner 602 includes: an interpolater 701, transformer 702, and kernel fitter 703.

In an exemplary embodiment, the interpolater 701 is configured to perform interpolation calculations for the 3-D data according to the position information of the blade to obtain a corresponding plurality of image data of the blade.

In an exemplary embodiment, the transformer 702 is configured to transform the plurality of image data output from the interpolater 701 to K-space respectively to obtain a corresponding plurality of K-space data of the blade, wherein, in some embodiments of the present application, the transformer 702 can be realized by use of FFT.

In an exemplary embodiment, the kernel fitter 703 is configured to perform kernel fitting for the plurality of K-space data to obtain a corresponding plurality of kernel data of the blade. In some embodiments of the present application, the kernel fitter 703 can be realized by use of the kernel fitting method described in the Step 203.

Through the kernel determiner 602 shown in FIG. 7, a plurality of kernel data of each blade can be acquired from the 3-D data obtained in advance, without separately scanning the reference signal for each blade, thus shortening the scan time for MRI greatly.

Further, the kernel determiner 602 shown in FIG. 7 comprises a slice shifter, used to perform a slice shift in the image domain or K-space for the plurality of image data obtained from interpolation calculations. In this case, the kernel fitter 703 performs kernel fitting for the plurality of shifted K-space data.

Figure 8:
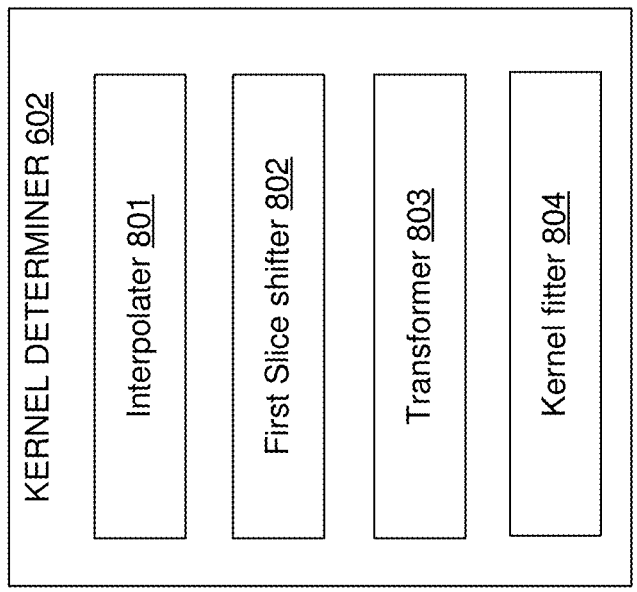
FIG. 8 shows a kernel determiner according to an exemplary embodiment.

To be specific, in some embodiments of the present application, the internal structure of the kernel determiner 602 can be shown in FIG. 8 and the kernel determiner mainly comprises:

an interpolater 801, used to perform interpolation calculations for the 3-D data according to the position information of the blade to obtain a corresponding plurality of image data of the blade, a first slice shifter 802, used to respectively perform a slice shift for a plurality of image data output from the interpolater 801 to obtain a plurality of shifted image data, wherein, in some embodiments of the present application, the slice shift can specifically mean performing a shift for a plurality of image data respectively in the image domain to increase the distance between the plurality of images, and the shift can particularly comprise translating the corresponding images of different slices a preset number of pixel point positions in the image domain, a transformer 803, used to transform the plurality of image data output from the first slice shifter 802 to K-space respectively to obtain a corresponding plurality of K-space data of the blade, wherein, in some embodiments of the present application, the transformer 803 can be realized by use of FFT, and a kernel fitter 804, used to perform kernel fitting for the plurality of K-space data output from the transformer 803 to obtain a corresponding plurality of kernel data of the blade, wherein, in some embodiments of the present application, the kernel fitter 804 can be realized by use of the kernel fitting method described in the Step 203.

Figure 9:
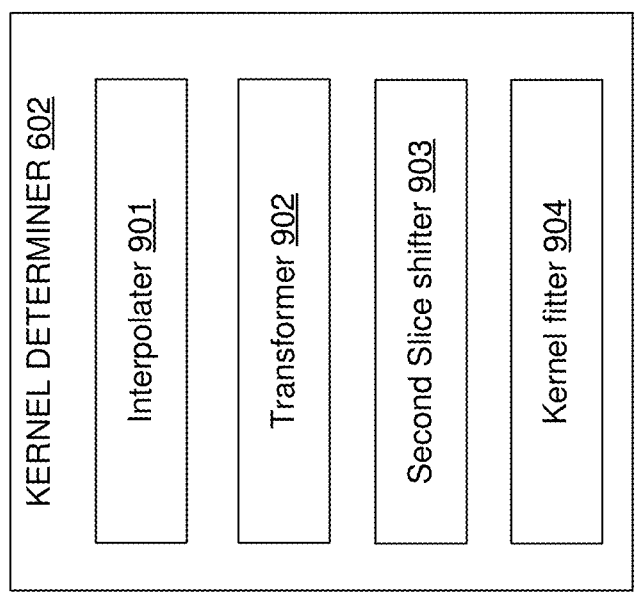
FIG. 9 shows a kernel determiner according to an exemplary embodiment.

In some embodiments of the present application, the internal structure of the kernel determiner 602 can be shown in FIG. 9 and the kernel determiner mainly comprises:

an interpolater 901, used to perform interpolation calculations for the 3-D data according to the position information of the blade to obtain a corresponding plurality of image data of the blade, a transformer 902, used to transform the plurality of image data output from the interpolater 901 to K-space respectively to obtain a corresponding plurality of K-space data of the blade, wherein, in some embodiments of the present application, the transformer 902 can be realized by use of FFT, a second slice shifter 903, used to respectively perform a slice shift for a plurality of K-space data output from the transformer 902 to obtain a plurality of shifted K-space data, wherein, in some embodiments of the present application, the slice shift can specifically mean adding a linear phase to a plurality of image data respectively in K-space of the frequency domain to increase the distance between the plurality of slices of images, and the shift can particularly comprise applying a linear gradient in the PE direction of different slices of images in K-space, and a kernel fitter 904, used to perform kernel fitting for the plurality of K-space data output from the second slice shifter 903 to obtain a corresponding plurality of kernel data of the blade, wherein, in some embodiments of the present application, the kernel fitter 904 can be realized by use of the kernel fitting method described in the Step 203.

Through the kernel determiner 602 shown in FIGS. 8 and 9, a plurality of kernel data of each blade can be acquired from the 3-D data obtained in advance, without separately scanning the reference signal for each blade, thus shortening the scan time greatly. In addition, the kernel determiner 602 shown in FIGS. 8 and 9 can further increase the distance between aliasing images by performing a slice shift in the image domain or K-space for the plurality of image data obtained from interpolation calculations. Thus, the purpose of reducing aliasing artifacts and the g-factor penalty can be achieved.

Figure 10:
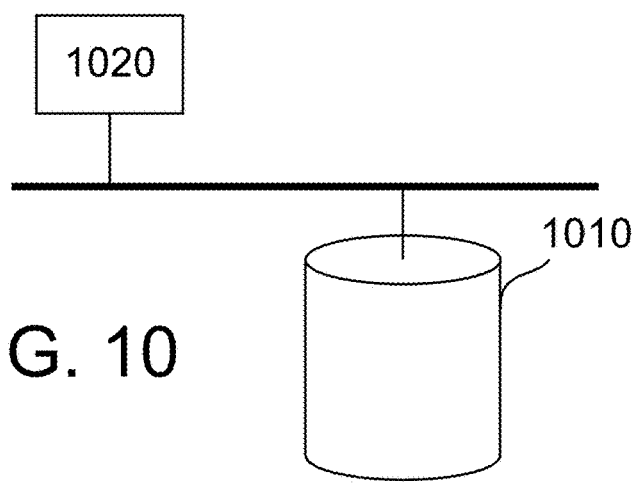
FIG. 10 shows a MRI device, according to an exemplary embodiment, configured to perform a blade sequence.

A MRI device according to an exemplary embodiment is shown in FIG. 10. In an exemplary embodiment, the hardware components of the MRI device include: at least one memory 1010 and at least one processor 1020. The at least one memory 1010 is configured to store a computer program. The at least one processor 1020 is configured to execute the computer program stored in the at least one memory to perform the MRI method based on a blade sequence according to one or more aspects of the present disclosure, such as the MRI method based on a blade sequence described in any of FIGS. 1 to 4. Alternatively, the computer program can be interpreted to cover the modules of the processing device shown in any of FIGS. 6 to 9.

In addition, at least a memory (1010) can further store an operating system. The operating system includes but is not limited to an Android operating system, Symbian operating system, Windows operating system and a Linux operating system.

At least one processor 1020 is configured to execute the computer program stored in at least one memory 1010 to perform the method in the embodiments of the present disclosure based on the function of at least one port receiving data. The processor 1020 can be a central processing unit (CPU), a processing unit/module, an application specific integrated circuit (ASIC), a logic module or a programmable gate array.

It should be noted that not all the steps in the flowcharts in FIGS. 1 to 4 or the modules in the structure charts shown in FIGS. 6 to 9 are necessary, and some steps or modules can be omitted according to the actual requirements. The execution sequence of the steps is not fixed and can be adjusted as required. The partition of the modules is a functional partition for the convenience of description. In the practical implementation, the function of a module can be realized by a plurality of modules, and the functions of a plurality of modules can be realized by one module and these modules can be located in the same equipment or can be located in different equipment.

The hardware modules in different embodiments can mechanically or electronically be realized. For example, a hardware module can comprise specially designed permanent circuits or logic devices (for example, application-specific processors such as field programmable gate array (FPGA) or ASIC) to complete specific operations. A hardware module can also comprise programmable logic devices or circuits (for example, general processors or other programmable processors) temporarily configured by software to perform specific operations. Whether a hardware module is realized mechanically, or by use of a dedicated permanent circuit or a temporarily configured circuit (for example, configured by software) can depend on the considerations of the cost and the time. In an exemplary embodiment, the hardware modules include processor circuitry that is configured to perform one or more functions/operations of the respective modules.

The present disclosure further provides a machine-readable storage medium (for example, computer-readable storage medium), which stores commands used to enable a machine to execute the MRI method based on a blade sequence described in the present application. Particularly, a system or device equipped with a storage medium can be provided. Software program codes which can realize the function in any of above-mentioned embodiments are stored in the storage medium and the computer (or CPU or MPU) of the system or device can read out and execute the program codes stored in the storage medium. In addition, through the commands based on the program codes, the operating system on the computer can complete a part of or all of practical operations. In addition, the program codes read out of the storage medium can be written into the memory in an expansion board in the computer or can be written into the memory in an expansion unit connected to the computer, and then the commands based on the program codes let the CPU installed on the expansion board or expansion unit execute a part or all of practical operations to realize the function in any of the above-mentioned embodiments. The storage medium used to provide program codes include a floppy disk, hard disk, magneto-optical disk, optical disk (for example, CD-ROM, CD-R, CD-RW, DVD-ROM, DVD-RAM, DVD-RW, DVD+RW), magnetic tape, non-volatile memory card, ROM. Alternatively, the program codes can be downloaded from the server computer over a communication network.

An experiment example is given below to describe the technical effects of the solutions in the present application.

Figure 11:
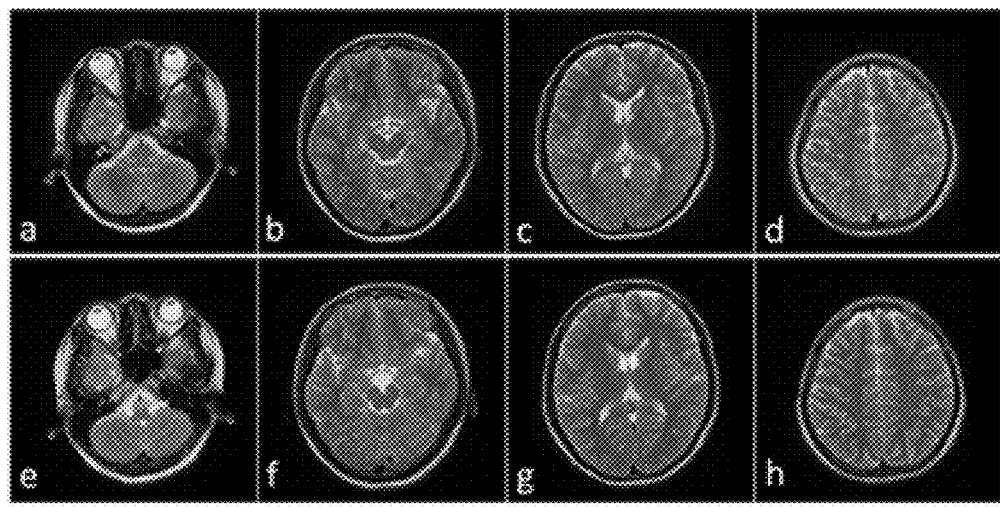
FIG. 11 shows a set of example scan images, where examples a-d are of images obtained from the scans using the method according to exemplary embodiments and examples e-h are of images obtained from the scans using the traditional TSE BLADE sequence.

In the experiment, the slice accelerating factor of the SMS-BLADE sequence is 2. In addition, the pre-scan data obtained by pre-scanning a 3-D GRE sequence is used as the 3-D data in Step 101 in the present application. The parameters of the 3-D data are as follows: the FOV is 500×500× 500 mm$^3$ and the matrix size is 64×64×64. Examples a-d in FIG. 11 respectively show four images obtained from the scans by using the method in the present application in the experimental environment. Examples e-h in FIG. 11 respectively show the four images obtained from the scans by using the traditional TSE-BLADE sequence and are used for comparison with Examples a-d. From Examples a-h, it can be seen that through the solutions in the present application, exact fitting can be performed to obtain a corresponding plurality of kernel data of each blade from pre-scan data, and then a plurality of clear images can be separated from a multi-slice aliasing image obtained from scans, without scanning the reference signal for each blade respectively. Therefore, the solutions disclosed in the present application can be combined with the advantages of the SMS technique and the BLADE sequence technique so that the problem with the image definition decrease caused by a motion of the object under test during a test can be overcome while the scan time is greatly reduced. If the solutions are further combined with the multi-blade readout technique, the whole measurement time can even drop to 30 seconds.

It should be understood that although the Description gives a description by embodiment, it does not mean that each embodiment contains only one independent technical solution. The description method in the Description is only for the sake of clarity. Those skilled in the art should consider the Description as an integral body. The technical solutions in all these embodiments can be combined properly to form other embodiments that those skilled in the art can understand.

The series of detailed descriptions above are only specific descriptions of feasible embodiments of the present disclosure and they are not intended to limit the scope of protection of the present disclosure. All equivalent embodiments or variants, for example, combination, division, or duplication of technical characteristics, without departing from the spirit of the present disclosure should fall within the scope of protection of the present disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST 101-105 Method operations
201-203 Method operations
301-304 Method operations
401-404 Method operations
501-503 Readout gradients
601 Pre-scanner
602 Kernel determiner
603 Data acquirer
604 Convoluter
605 Image reconstructor
701, 801, 901 Interpolater
702, 803, 902 Transformer
703, 804, 904 Kernel fitter
802 First slice shifter
903 Second slice shifter
1010 Memory
1020 Processor

The invention claimed is:

1. A magnetic resonance imaging (MRI) method based on a blade sequence, comprising:
acquiring three-dimensional (3-D) data collected by a surface coil,
determining corresponding plurality of kernel data of each blade from the 3-D data according to position information of each blade,
collecting a corresponding plurality of slices of aliasing K-space data of each blade,
performing convolution operations for the corresponding plurality of slices of aliasing K-space data of each blade and the corresponding plurality of kernel data of each blade to obtain a corresponding plurality of unaliasing K-space data of each blade, and
reconstructing images for the corresponding plurality of unaliasing K-space data of different blades to obtain a plurality of unaliasing images.

2. A magnetic resonance imaging (MRI) device based on a blade sequence, comprising:
a pre-scanner configured to acquire three-dimensional (3-D) data collected by a surface coil,
a kernel determiner configured to determine a corresponding plurality of kernel data of each blade from the 3-D data according to position information of each blade,
a data acquirer configured to collect a corresponding plurality of slices of aliasing K-space data of each blade,
a convoluter configured to perform convolution operations for the corresponding plurality of slices of aliasing K-space data of each blade and the corresponding plurality of kernel data of each blade to obtain a corresponding plurality of unaliasing K-space data of each blade, and
an image reconstructor configured to reconstruct images for the corresponding plurality of unaliasing K-space data of different blades to obtain a plurality of unaliasing images.

3. The method as claimed in claim 1, wherein the 3-D data comprises 3-D pre-scan data or 3-D field mapping data.

4. The method as claimed in claim 1, wherein determining a corresponding plurality of kernel data of each blade from the 3-D data comprises, for each blade, respectively:
performing interpolation calculations for the 3-D data according to the position information of the blade to obtain a corresponding plurality of image data of the blade,
transforming the plurality of image data to K-space respectively to obtain a corresponding plurality of K-space data of the blade, and
performing kernel fitting for the plurality of K-space data to obtain a corresponding plurality of kernel data of the blade.

5. The method as claimed in claim 4, wherein determining a corresponding plurality of kernel data of each blade from the 3-D data further comprises performing a slice shift in an image domain or K-space for the plurality of image data obtained from interpolation calculations.

6. The method as claimed in claim 5, wherein the performing a slice shift in the image domain for the plurality of image data obtained from interpolation calculations comprises respectively translating the plurality of image data obtained from interpolation calculations a preset number of pixel point positions in the image domain before transforming the image data to K-space.

7. The method as claimed in claim 5, wherein the performing a slice shift in K-space for the plurality of image data obtained from interpolation calculations comprises respectively applying a linear gradient in the phase encoding direction of each image datum which is transformed to K-space in K-space after transforming the image data to K-space.

8. The method as claimed in claim 4, wherein:
the position information of each blade comprises the field of view (FOV), slice position information, and slice direction information of each blade, and
performing interpolation calculations for the 3-D data according to the position information of the blade to obtain a corresponding plurality of image data of the blade comprises:
obtaining the spatial position coordinates of each corresponding pixel of the blade according to the FOV, slice position information, and slice direction information of the blade, and
respectively taking the corresponding data of the spatial position coordinates out of the 3-D data according to the spatial position coordinates of each corresponding pixel of the blade through interpolation calculations.

9. The method as claimed in claim 4, wherein performing kernel fitting for the plurality of K-space data comprises:
using a plurality of image data, which is acquired from the 3-D data, corresponds to a blade and respectively corresponds to a plurality of different slices as unaliasing image data,
using the image data obtained by overlaying the plurality of image data as aliasing image data, and
performing transposed convolution operations according to the unaliasing image data and the aliasing image data to obtain the corresponding kernel data of different slices of images.

10. The method as claimed in claim 1, wherein reconstructing images for the corresponding plurality of unaliasing K-space data of different blades comprises:
putting the corresponding unaliasing K-space data of the blades corresponding to the same slice in a group to obtain a plurality of groups of unaliasing K-space data, wherein each group of unaliasing K-space data corresponds to one slice of images, and
for each group of unaliasing K-space data, respectively using the blade reconstruction method to reconstruct images for the corresponding plurality of unaliasing K-space of different blades to obtain a plurality of reconstructed unaliasing images.

11. The method as claimed in claim 1, further comprising setting a plurality of readout gradients in a readout period for reading out a sequence so that a corresponding plurality of slices of aliasing K-space data of a plurality of blades can be read out simultaneously through an excitation.

12. The device as claimed in claim 2, wherein the kernel determiner comprises:
an interpolater configured to perform interpolation calculations for the 3-D data according to the position information of the blade to obtain a corresponding plurality of image data of the blade,
a transformer configured to transform the plurality of image data to K-space respectively to obtain a corresponding plurality of K-space data of the blade, and
a kernel fitter configured to perform kernel fitting for the plurality of K-space data to obtain a corresponding plurality of kernel data of the blade.

13. The device as claimed in claim 2, wherein the kernel determiner further comprises a slice shifter configured to perform a slice shift in the image domain or K-space for the plurality of image data obtained from interpolation calculations, and wherein the kernel fitter is configured to perform kernel fitting for the plurality of shifted K-space data.

14. The device as claimed in claim 13, wherein the slice shifter comprises: a first slice shifter configured to respectively translate a plurality of image data output from the interpolater a preset number of pixel point positions in the image domain.

15. The device as claimed in claim 13, wherein the slice shifter further comprises: a second slice shifter configured to respectively apply a linear gradient in the phase encoding direction of a plurality of K-space data output from the transformer to obtain a plurality of shifted K-space data.

16. The device as claimed in claim 2, further comprising a controller, wherein the pre-scanner, the kernel determiner, the data acquirer, the convoluter, and the image reconstructor are comprised within the controller.

17. The device as claimed in claim 16, further comprising a MRI scanner connected to the controller.

18. A magnetic resonance imaging (MRI) device, comprising:
a memory that stores one or more computer programs, and
a processor configured to execute the one or more computer programs stored in the memory to perform the MRI method as claimed in claim 1.

19. A non-transitory computer-readable storage medium with an executable program stored thereon, that when executed, instructs a processor to perform the method of claim 1.

20. A computer program product having a computer program which is directly loadable into a memory of a controller of the magnetic resonance device, when executed by the controller, causes the magnetic resonance device to perform the method as claimed in claim 1.

21. The method as claimed in claim 1, wherein determining a corresponding plurality of kernel data of each blade from the 3-D data comprises:
for each blade, performing interpolation calculations for the 3-D data according to the position information of the blade to obtain a corresponding plurality of image data of the blade; and
performing a slice shift in an image domain or K-space for the plurality of image data obtained from interpolation calculations.

* * * * *